(12) United States Patent
Schwartzmann et al.

(10) Patent No.: US 6,800,514 B2
(45) Date of Patent: Oct. 5, 2004

(54) METHOD OF FABRICATING A MOS TRANSISTOR WITH A DRAIN EXTENSION AND CORRESPONDING TRANSISTOR

(75) Inventors: Thierry Schwartzmann, Le Versoud (FR); Hervé Jaouen, Meylan (FR)

(73) Assignee: STMicroelectronics SA, Montrouge (FR)

( * ) Notice: Subject to any disclaimer, the term of this patent is extended or adjusted under 35 U.S.C. 154(b) by 33 days.

(21) Appl. No.: 10/184,036

(22) Filed: Jun. 27, 2002

(65) Prior Publication Data

US 2003/0008486 A1 Jan. 9, 2003

(30) Foreign Application Priority Data

Jun. 29, 2001 (FR) .............................. 01 08677

(51) Int. Cl.⁷ .......................................... H01L 21/338
(52) U.S. Cl. .................. 438/183; 438/184; 438/527; 438/549
(58) Field of Search ................. 438/183, 184, 438/185, 286, 303, 527, 529, 545, 549

(56) References Cited

U.S. PATENT DOCUMENTS

| | | | |
|---|---|---|---|
| 5,510,648 A | 4/1996 | Davies et al. | 257/657 |
| 6,027,964 A | 2/2000 | Gardner et al. | 438/238 |
| 6,078,080 A | 6/2000 | Kadosh et al. | 257/344 |
| 6,111,292 A | 8/2000 | Gardner et al. | 257/344 |
| 6,169,315 B1 | 1/2001 | Son | 257/408 |
| 6,180,502 B1 | 1/2001 | Liang | 438/595 |
| 6,251,729 B1 * | 6/2001 | Montree et al. | 438/257 |
| 6,492,249 B2 * | 12/2002 | Xiang et al. | 438/586 |

* cited by examiner

*Primary Examiner*—Wael Fahmy
*Assistant Examiner*—Ginette Peralta
(74) *Attorney, Agent, or Firm*—Allen, Dyer, Doppelt, Milbrath & Gilchrist, P.A.; Lisa K. Jorgenson

(57) ABSTRACT

A MOS transistor with a drain extension includes an isolation block on the upper surface of a semiconductor substrate. The isolation block has a first sidewall next to the gate of the transistor, and a second sidewall that is substantially parallel to the first sidewall. The isolation block further includes a drain extension zone in the substrate under the isolation block, and a drain region in contact with the drain extension zone. The drain region is in the substrate but is not covered by the isolation block.

18 Claims, 5 Drawing Sheets

METHOD OF FABRICATING A MOS TRANSISTOR WITH A DRAIN EXTENSION AND CORRESPONDING TRANSISTOR

FIELD OF THE INVENTION

The present invention relates to integrated circuits, and more particularly, to an isolated gate field effect transistor (MOSFET) with a drain extension.

BACKGROUND OF THE INVENTION

A MOS transistor with a drain extension allows the use of a drain voltage greater than that used for conventional MOS transistors, without damaging the gate oxide. Currently, in order to obtain such transistors, the implantation of the drain region is moved away from the gate by a photolithography step.

Moreover, to produce the drain extension zone, which has a length greater than the source extension zone, a specific implantation is carried out with lower doping than that used to produce the source and drain extensions of the conventional MOS transistors. This makes it possible to decrease the electrical field near the gate oxide.

The major drawback of the current approaches lies in the fact that the implantation of the drain region is not self-aligned with the gate, which causes an appreciable dispersion in the electrical characteristics, especially of the series resistors This is due to the alignment errors of the photolithography masks respectively used for etching the gate and for the implantation away from the drain region.

SUMMARY OF THE INVENTION

In view of the foregoing background, an object of the present invention is to provide a MOS transistor with a drain extension whose implantation of the drain region is self-aligned with the gate, and which consequently does not have dispersion of the electrical parameters described above.

This and other objects, advantages and features in accordance with the present invention are provided by a method of fabricating a MOS transistor with a drain extension comprising producing in the substrate an implanted drain region located at a distance from the gate which is greater than the distance separating the gate from the implanted source region. The method further comprises producing a drain extension zone in the substrate between the drain region and the gate.

According to a general characteristic of the invention, the method may comprise a preliminary step in which the gate of the transistor and a sacrificial block are produced on the upper surface of the substrate using a single photolithographic mask and the same gate material. The sacrificial block is separated from the gate by a distance equal to the desired length for the drain extension Moreover, the production of the drain extension may comprise a specific implantation of dopants in the substrate between the gate and the sacrificial block. The production of the implanted drain region may comprise an implantation of dopants in the substrate zone located under the sacrificial block, after the sacrificial block has been removed. Thus, by using a single photolithographic mask to define the gate and the sacrificial block, and consequently the position of the implantation of the drain region, a drain region is obtained which is self-aligned with the gate. The drain extension region is also self-aligned with the gate.

More specifically, according to one embodiment of the invention, after the specific implantation of the drain extension, the space between the gate and the sacrificial block is filled with an isolating material to form an isolating block. The sacrificial block is removed for leaving the isolating block next to the gate and having a substantially vertical abrupt uncovered sidewall. The drain implantation is then carried out in the substrate on the same side as the uncovered sidewall of the isolating block.

In this case, the self-alignment of the implantation of the drain region results from the self-alignment of the isolating block with respect to the gate. The removal of the sacrificial block comprises, for example, the formation of a block of resin covering the gate and leaving the sacrificial block uncovered, and etching of the gate material of the sacrificial block.

According to a first variation of the invention, the formation of the isolating block may comprise deposition of an isolating layer on the structure obtained at the end of the preliminary step, chemical-mechanical polishing of the isolating layer and etching of the isolating layer on each side of the assembly formed by the gate, the sacrificial block and the isolating material placed between the gate and the sacrificial block. The isolating layer advantageously comprises a silicon nitride sublayer covered with a silicon oxide layer, such as TEOS, for example. Moreover, the chemical-mechanical polishing stops on the silicon nitride sublayer.

According to one embodiment of the invention, the method moreover comprises, after producing the implanted drain region, an additional step in which lateral isolating regions (spacers) are formed. These regions are respectively leaning against the abrupt uncovered sidewall of the isolating block and against the uncovered sidewall of the gate. These lateral isolating regions have, conventionally, a curved outer edge in contrast with the isolating block which has abrupt and substantially vertical outer edges.

According to another variation of the invention, which does not require chemical-mechanical polishing, the method comprises, after the preliminary step, a step of forming lateral isolating regions (spacers) comprising a conformal deposition on the structure obtained at the end of the preliminary step. This comprises an isolating layer having a thickness chosen depending on the width of the base desired for the lateral isolating regions. The method may further comprise an anisotropic etching of the isolating layer, so as to form lateral isolating regions leaning respectively against the gate sidewall furthest from the sacrificial block, and against the sacrificial block sidewall furthest from the gate.

Moreover, to fill the space between the gate and the sacrificial block during the conformal deposition of the isolating layer, thus forming the isolating block, the distance separating the gate and the sacrificial block is at the most equal to twice the thickness of the isolating layer deposited.

A variation may be integrated into conventional MOS transistor fabrication technology, especially with regards to producing spacers for the various transistors To be able to use the conventional method of spacer formation, the distance separating the gate and the sacrificial block must be at least twice the thickness of the isolating layer deposited, without which the space between the gate and the sacrificial block will not be filled correctly. The isolating layer forming the spacers and the isolating block advantageously comprises a silicon oxide sublayer, such as TEOS, for example, covered with a silicon nitride layer.

Another aspect of the invention is directed to a MOS transistor with a drain extension. The MOS transistor comprises an isolating block resting on the upper surface of a semiconductor substrate. This isolating block has a first sidewall next to the gate of the transistor, and a second abrupt sidewall substantially vertical and substantially parallel to the first sidewall. Moreover, the transistor comprises a drain extension zone in the substrate under the isolating block, and a drain region in contact with the drain extension zone and in a zone of the substrate located outside the isolating block.

According to one embodiment of the invention, the transistor comprises lateral isolating regions (spacers) leaning respectively against the second abrupt sidewall of the isolating block, and against the gate sidewall away from the one which is right next to the isolating block. These lateral isolating regions may have a curved outer edge. Advantageously, the isolating block comprises a silicon nitride sublayer covered with a silicon oxide layer, such as TEOS, for example.

According to another variation, the transistor comprises a lateral isolating region (spacer) leaning against the gate sidewall away from the one which is right next to the isolating block, and another lateral isolating region (spacer) located facing and at a distance from the second abrupt sidewall of the isolating block. The two lateral isolating regions may have curved outer edges. Moreover, the drain region in contact with the drain extension zone lies in a zone of the substrate located between the isolating block and this other lateral isolating region (spacer). Advantageously then, the isolating block comprises a silicon oxide sublayer covered with a silicon nitride layer.

Regardless of the embodiment, the lateral isolating regions (spacers) comprise, for example, a silicon oxide sublayer covered with a silicon nitride layer. The subject of the invention is also directed to an integrated circuit comprising at least one MOS transistor with a drain extension as defined above.

BRIEF DESCRIPTION OF THE DRAWINGS

Other advantages and characteristics of the invention will become apparent on examining the detailed description of embodiments which are in no way limiting, and of appended drawings, in which.

DETAILED DESCRIPTION OF THE PREFERRED EMBODIMENTS

Figure 1:
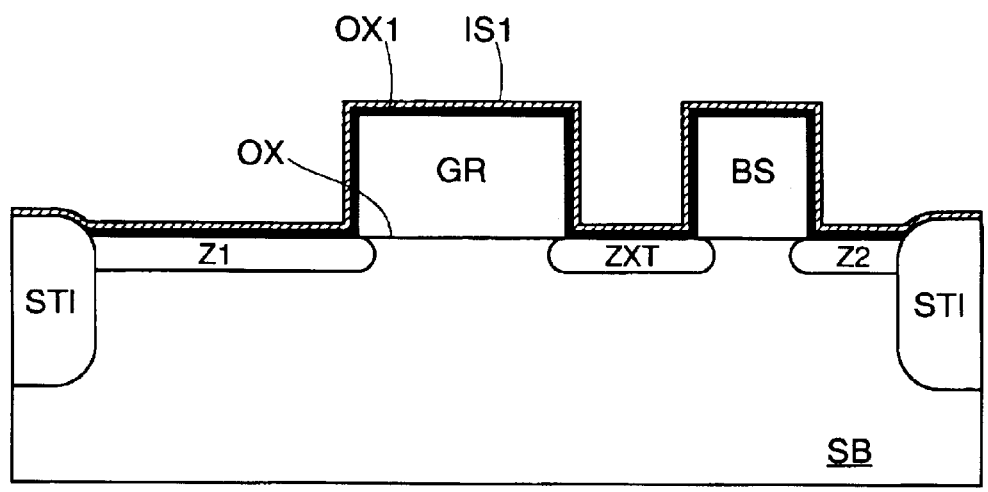
FIGS. 1 to 6 illustrate schematically the main steps of a first embodiment of the method for forming a first embodiment of a transistor in accordance with the present invention.

In FIG. 1, the reference SB denotes a semiconductor substrate comprising an active zone delimited by a lateral isolation region STI. This lateral isolation region may be of the shallow trench isolation type or of the local oxidation (LOCOS) type. A layer of silicon oxide OX for forming the gate oxide of the transistor is grown on the surface of the active zone.

A layer of a gate material, such as polysilicon, for example, which may be doped in situ, is deposited in a conventional manner on the upper surface of the substrate SB. A photolithography step is then carried out, in particular, comprising the preparation of an etching mask making it possible to define the gate GR of the transistor and a sacrificial block BS separated from the gate GR.

The anisotropic etching of the layer of the gate material is carried out so as to obtain the gate GR of the transistor and the sacrificial block BS. At the end of this preliminary step, the structure thus obtained is reoxidized, for example, by a thermal growth, so as to form a fine layer of silicon oxide OX1.

Dopants, chosen according to the type of transistor (NMOS or PMOS) desired in the substrate SB, are implanted. This implantation is a specific implantation carried out at a lower dose than the conventional implantations of the other MOS transistors. This then makes it possible to produce, in the substrate SB, the drain extension zone ZXT, which lies under the surface of the substrate between the gate GR and the sacrificial block BS. By way of example, this specific implantation leads to a concentration of about $10^{17}$ at/cm$^3$, while for conventional implantations for MOS transistors, concentrations of about $10^{19}$ at/cm$^3$ are reached.

Of course, this specific implantation gives rise to the formation in the substrate to the left of the gate GR and to the right of the sacrificial block, of two other implanted zones Z1 and Z2. It should also be noted that, since in general the integrated circuit also comprises other MOS transistors, prior to the specific implantation, an additional photolithography step is carried out. This makes it possible for the specific implantation to be carried out only in the active zone of the substrate which is intended to accommodate the MOS transistor with a drain extension. The other MOS transistors are protected by the resin.

Figure 2:
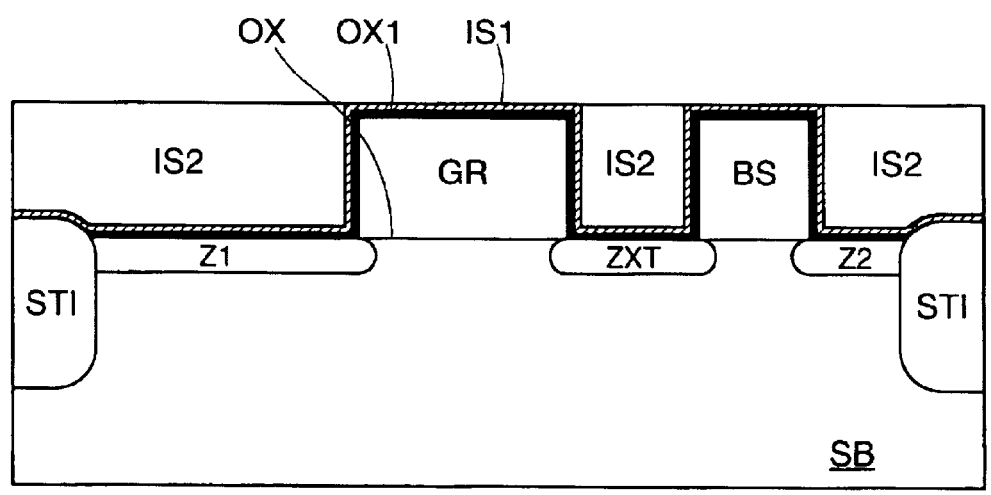

The following step, illustrated in FIG. 2, includes depositing an isolating layer on the structure obtained in FIG. 1. This isolating layer is formed from a sublayer IS1 which is a fine layer of silicon nitride deposited in a known manner, and from a second layer IS2 formed from TEOS (tetraethylorthosilicate), for example, which is also deposited in a known manner. Chemical-mechanical polishing is then carried out, stopping on the layer IS1 above the gate GR and the sacrificial block BS.

Figure 3:
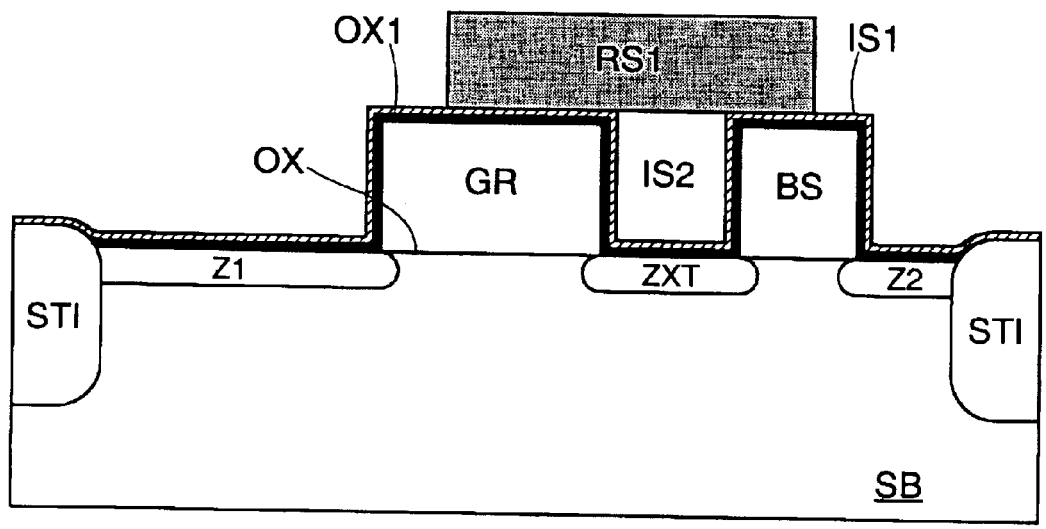

A resin block RS1 is then defined (FIG. 3) in a conventional manner by a photolithography step. This block of resin makes it possible to protect the oxide IS2 placed between the gate GR and the sacrificial block BS. It is then possible to carry out conventional etching of this TEOS to the left of the gate GR and to the right of the sacrificial block BS.

Figure 4:
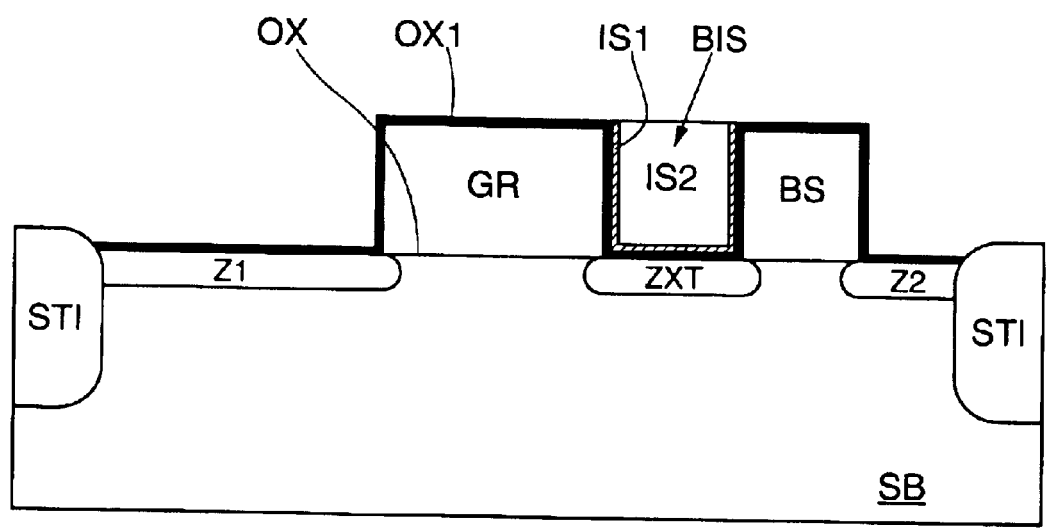

The sublayer of silicon nitride IS1 is then etched and an isolating block BIS, placed between the gate GR and the sacrificial block BS is obtained, as illustrated in FIG. 4. At this stage of the process, it is possible to correct the doping of the source extension zone Z1 by an additional implantation of dopants. This implantation correction could also have taken place in the preceding step illustrated in FIG. 3.

Figure 5:
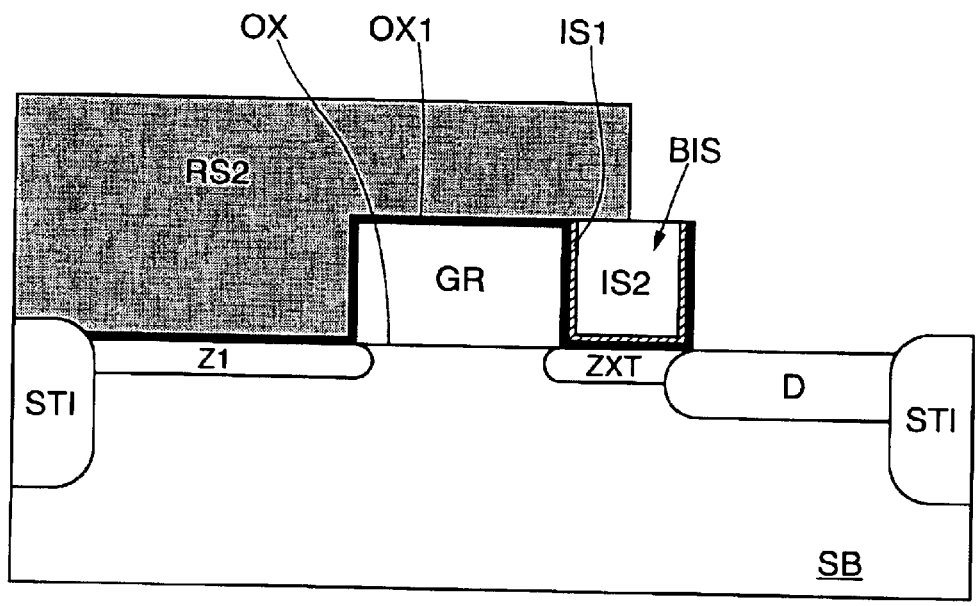
Figure 6:
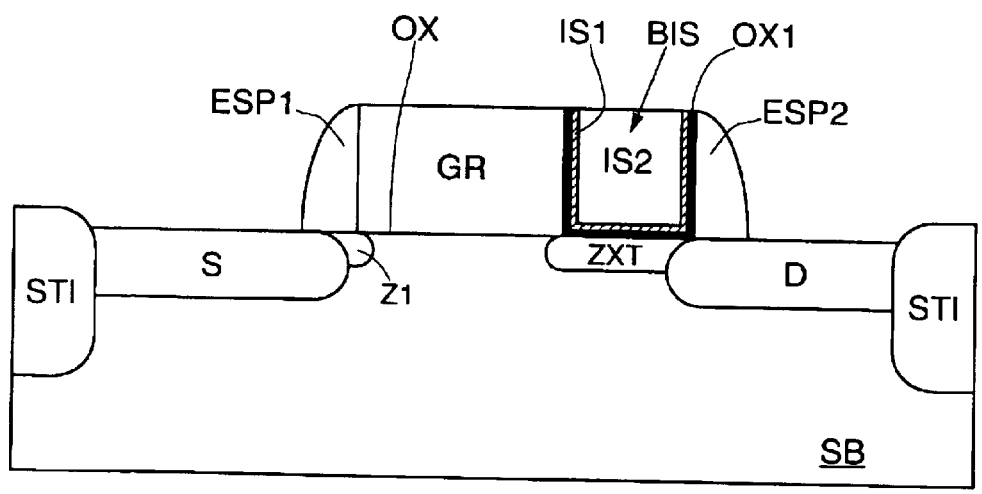

A resin block RS2 is then produced (FIG. 5) by another conventional photolithography step, which has the function of protecting the gate material of the gate GR. The oxide layer OX1 outside the resin block RS2 is then cleaned in a conventional manner. Then the sacrificial block BS is removed by etching the gate material. The implantation of the drain region D is then carried out in the substrate SB.

This implantation is carried out in a self-aligned manner on the gate GR, since it is limited by the uncovered abrupt vertical sidewall of the block BIS, as readily understood by those skilled in the art. Also, this block BIS is formed by filling a space between the gate GR and the sacrificial block which have been produced by a single photolithography mask. In other words, the implantation of, the drain region does not result from producing any other photolithography mask than the one which was needed for producing the gate.

The drain region D therefore lies in the substrate in contact with the drain extension zone ZXT. It extends, by diffusion, slightly under the block BIS. The lateral isolating regions ESP1 and ESP2 (spacers), which are respectively on the uncovered abrupt vertical sidewall of the isolating block BIS and on the uncovered vertical sidewall of the gate GR are produced in a conventional manner. The implantation of the source region S is carried out, and the transistor T with a drain extension thus obtained is completed by conventional finishing steps, such as forming electrical contacts on the source, drain and gate regions.

Figure 7:
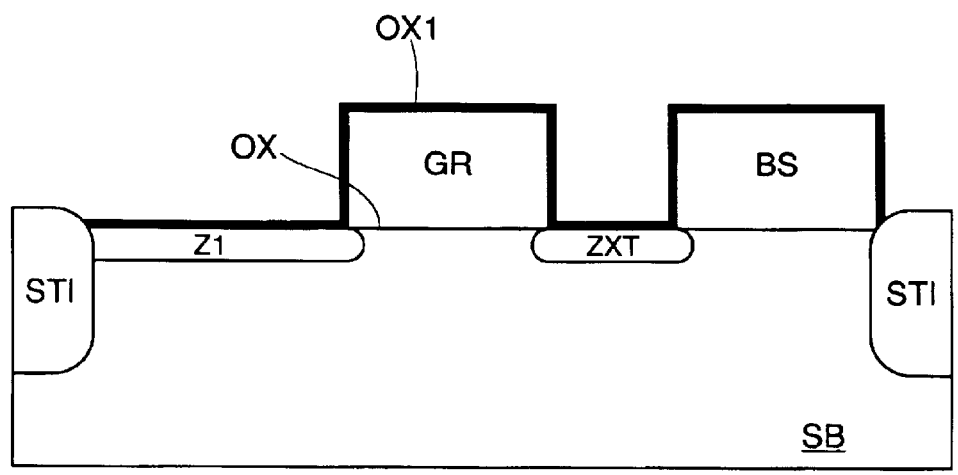
FIGS. 7 to 10 illustrate schematically the main steps of a second embodiment for forming a second embodiment of a transistor in accordance with the present invention.

A variation of the embodiment illustrated above which does not involve the use of chemical-mechanical polishing will now be described, with more particular reference to FIGS. 7 to 10. This variation starts in a similar manner to the one which has been described with reference to FIG. 1, so as to obtain (FIG. 7) a gate block GR spaced apart from a sacrificial block BS. In FIG. 7, the block BS extends just over the lateral isolation region STI.

Figure 8:
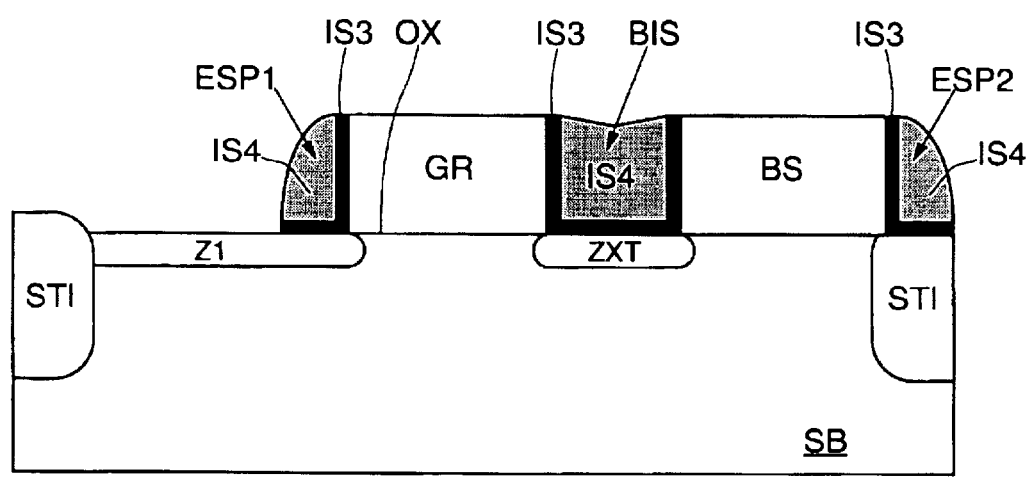
Figure 9:
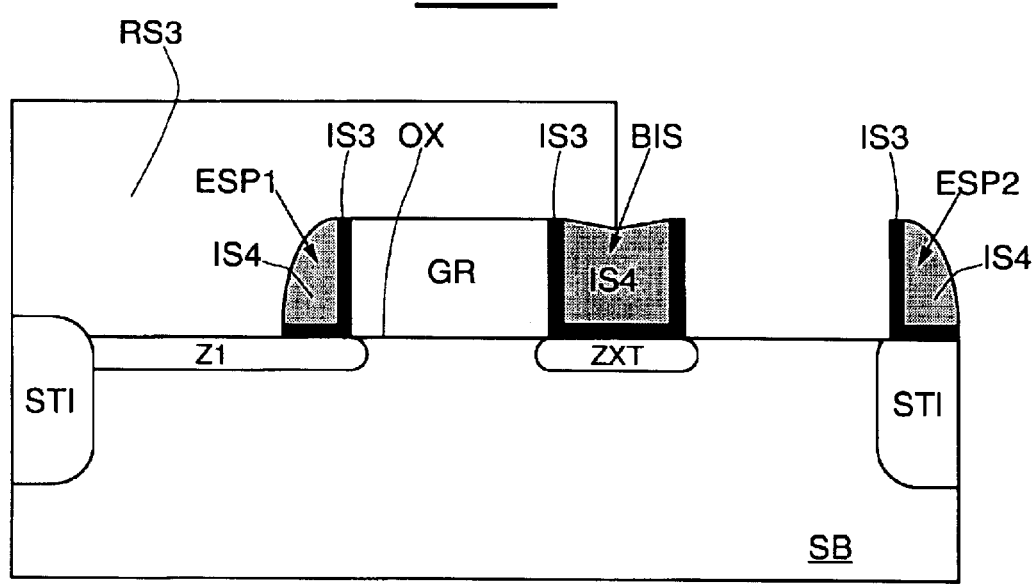

The following step, illustrated in FIG. 8, includes producing isolating spacers ESP1 and ESP2 in a conventional manner, which will lean respectively against the left edge of the gate GR and against the right edge of the sacrificial block BS. The isolating spacers are produced by a conformal deposition of a fine layer of silicon oxide, such as TEOS, for example, then by a conformal deposition of an upper isolating layer IS4, such as silicon nitride, for example, coating the TEOS sublayer IS3.

However, although in the first variation and in this second variation the length of the drain extension zone ZXT is determined by the photolithography mask, this distance should be chosen to be at most equal to twice the thickness of the silicon nitride layer IS4. Thus, when depositing the layer IS4, the space between the gate and the sacrificial block is filled, so as to form the isolating block BIS.

Figure 10:
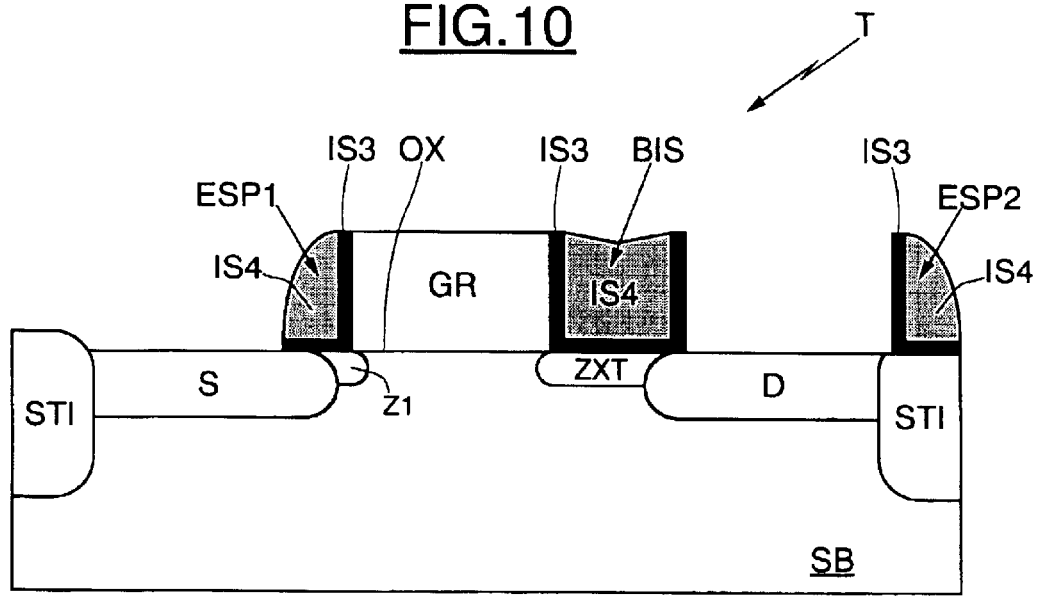

A block of resin RS3 is then prepared (FIG. 9) by a conventional photolithography step. This block of resin RS3 is designed to protect the gate material of the gate GR of the transistor. The sacrificial block BS can then be removed by conventional etching. Implantation of the drain region D between the uncovered abrupt vertical sidewall of the isolating block BIS and the spacer ESP2 is then carried out (FIG. 10). Just as in the first variation, the implantation of the drain region is also self-aligned with the gate GR. The implantation of the source region S is then carried out. The transistor T with a drain extension is completed using conventional finishing steps.

That which is claimed is:

1. A method of fabricating a MOS transistor with a drain extension region, the method comprising:
   forming on a substrate a gate and a sacrificial block spaced apart from the gate using a same mask, the gate and sacrificial block comprising a same material;
   forming the drain extension region in the substrate between the gate and the sacrificial block;
   forming a source region in the substrate at a first distance from the gate;
   removing the sacrificial block for exposing a first portion of the substrate; and
   forming in the first portion of the substrate a drain region contacting the drain extension region, the drain region being at a second distance from the gate that is greater than the first distance.

2. A method according to claim 1, further comprising depositing an isolation material between the gate and the sacrificial block for forming an isolation block therebetween, the isolation block being formed after forming the drain extension region; wherein removing the sacrificial block exposes a substantially vertical sidewall of the isolation block; and wherein the drain region is formed on a same side as the exposed substantially vertical sidewall of the isolation block.

3. A method according to claim 2, wherein removing the sacrificial block comprises:
   masking the gate while leaving the sacrificial block uncovered; and
   etching the sacrificial block.

4. A method according to claim 2, wherein forming the isolation block comprises:
   forming an isolation layer on the substrate after the gate, the sacrificial block and the drain extension region have been formed;
   polishing the isolation layer; and
   etching the isolation layer on each side of the gate and the sacrificial block except for the isolation layer therebetween forming the isolation block.

5. A method according to claim 4, wherein the isolation layer comprises a silicon nitride layer and a silicon oxide layer thereon; and wherein the polishing stops on the silicon nitride sublayer.

6. A method according to claim 2, further comprising forming lateral isolation regions on the substrate contacting the exposed substantially vertical sidewall of the isolation block and an uncovered sidewall of the gate, the lateral isolation regions having a curved outer edge and being formed after the drain region is formed.

7. A method according to claim 1, further comprising forming lateral isolation regions on the substrate by:
   forming an isolating layer on the substrate after the gate, the sacrificial block and the drain extension region have been formed, with an isolation block being formed between the gate and the sacrificial block and having a thickness corresponding to a base width of the lateral isolation regions, and a distance separating the gale and the sacrificial block is less than or equal to twice the thickness of the isolating layer for filling a space therebetween; and
   etching the isolating layer for forming the lateral isolation regions contacting a sidewall of the gate furthest from the sacrificial block, and contacting a sidewall of the sacrificial block sidewall furthest from the gate.

8. A method according to claim 7, wherein forming the isolating layer comprises a conformal deposition; and wherein etching the isolating layer comprises an anisotropic etching.

9. A method according to claim 7, wherein the isolating layer comprises a silicon oxide layer and a silicon nitride layer thereon.

10. A method of fabricating a MOS transistor comprising:
    forming on a substrate a gate and a sacrificial block spaced apart from the gate using a same mask, the gate and sacrificial block comprising a same material;
    forming a drain extension region in the substrate between the gate and the sacrificial block;
    forming an isolation block on the substrate between the gate and the sacrificial block;
    forming a source region in the substrate;
    removing the sacrificial block for exposing a first portion of the substrate; and
    forming in the first portion of the substrate a drain region contacting the drain extension region.

11. A method according to claim 10, wherein forming the isolation block comprises depositing an isolation material between the gate and the sacrificial block; wherein removing the sacrificial block exposes a substantially vertical sidewall of the isolation block; and wherein the drain region is formed on a same side as the exposed substantially vertical sidewall of the isolation block.

12. A method according to claim 11, wherein removing the sacrificial block comprises:
   forming a block of resin on the gate while leaving the sacrificial block uncovered; and
   etching the sacrificial block.

13. A method according to claim 11, wherein forming the isolation block comprises:
   forming an isolation layer on the substrate after the gate, the sacrificial block and the drain extension region have been formed;
   polishing the isolation layer; and
   etching the isolation layer on each side of the gate and the sacrificial block except for the isolation layer therebetween forming the isolation block.

14. A method according to claim 13, wherein the isolation layer comprises a silicon nitride layer and a silicon oxide layer thereon; and wherein the polishing stops on the silicon nitride sublayer.

15. A method according to claim 11, further comprising forming lateral isolation regions on the substrate contacting the exposed substantially vertical sidewall of the isolation block and an uncovered sidewall of the gate, the lateral isolation regions having a curved outer edge and being formed after the drain region is formed.

16. A method according to claim 11, further comprising forming lateral isolation regions on the substrate, the forming comprising:
   forming an isolating layer on the substrate after the gate, the sacrificial block, the isolation block and the drain extension region have been formed, with the isolation block having a thickness corresponding to a base width of the lateral isolation regions, and a distance separating the gate and the sacrificial block is less than or equal to twice the thickness of the isolating layer for filling a space therebetween; and
   etching the isolating layer for forming the lateral isolation regions contacting a sidewall of the gate furthest from the sacrificial block, and contacting a sidewall of the sacrificial block sidewall furthest from the gate.

17. A method according to claim 16, wherein forming the isolating layer comprises a conformal deposition; and wherein etching the isolating layer comprises an anisotropic etching.

18. A method according to claim 16, wherein the isolating layer comprises a silicon oxide layer and a silicon nitride layer thereon.

* * * * *